(12) United States Patent
Chang et al.

(10) Patent No.: US 8,633,115 B2
(45) Date of Patent: Jan. 21, 2014

(54) METHODS FOR ATOMIC LAYER ETCHING

(75) Inventors: Mei Chang, Saratoga, CA (US); Joseph Yudovsky, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 105 days.

(21) Appl. No.: 13/307,524

(22) Filed: Nov. 30, 2011

(65) Prior Publication Data

US 2013/0137267 A1    May 30, 2013

(51) Int. Cl.
*H01L 21/302* (2006.01)
*H01L 21/461* (2006.01)

(52) U.S. Cl.
USPC ........... 438/706; 438/707; 438/708; 438/709; 438/715; 438/716

(58) Field of Classification Search
None
See application file for complete search history.

(56) References Cited

U.S. PATENT DOCUMENTS

| | | | |
|---|---|---|---|
| 6,821,563 B2 | 11/2004 | Yudovsky | |
| 7,572,686 B2 | 8/2009 | Levy et al. | |
| 7,749,917 B1 * | 7/2010 | Rana et al. | 438/765 |
| 8,003,483 B2 * | 8/2011 | Suzawa et al. | 438/406 |
| 8,372,753 B2 * | 2/2013 | Rana et al. | 438/706 |
| 2006/0156979 A1 | 7/2006 | Thakur et al. | |
| 2011/0139748 A1 | 6/2011 | Donnelly et al. | |

FOREIGN PATENT DOCUMENTS

| | | |
|---|---|---|
| JP | 07183256 | 7/1995 |
| JP | 7263424 | 10/1995 |
| KR | 10-2011-0098355 | 2/2010 |

OTHER PUBLICATIONS

International Search Report, mailed Mar. 20, 2013, for PCT/US2012/066757, which corresponds to the U.S. Appl. No. 13/307,524.

* cited by examiner

*Primary Examiner* — Duy Deo
(74) *Attorney, Agent, or Firm* — Servilla Whitney LLC

(57) ABSTRACT

Provided are methods of etching a substrate using atomic layer deposition apparatus. Atomic layer deposition apparatus including a gas distribution plate with a thermal element are discussed. The thermal element is capable of locally changing the temperature of a portion of the surface of the substrate to vaporize an etch layer deposited on the substrate.

11 Claims, 8 Drawing Sheets

METHODS FOR ATOMIC LAYER ETCHING

BACKGROUND

Embodiments of the invention generally relate to an apparatus and a method for depositing materials. More specifically, embodiments of the invention are directed to a atomic layer deposition chambers with linear reciprocal motion.

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 μm and aspect ratios of 10 or greater. Accordingly, conformal deposition of materials to form these devices is becoming increasingly important.

During an atomic layer deposition (ALD) process, reactant gases are introduced into a process chamber containing a substrate. Generally, a region of a substrate is contacted with a first reactant which is adsorbed onto the substrate surface. The substrate is then contacted with a second reactant which reacts with the first reactant to form a deposited material. A purge gas may be introduced between the delivery of each reactant gas to ensure that the only reactions that occur are on the substrate surface.

There are many instances where the optimal reaction conditions for the first reactant are not the same as those of the second reactant. It is inefficient to change the temperature of the entire chamber and substrate between reactions. Additionally, some reaction conditions may cause long-term damage to the substrate and resulting device if conditions are maintained for too long. Therefore, there is an ongoing need in the art for improved apparatuses and methods of processing substrates by atomic layer deposition under more optimal reaction conditions.

SUMMARY

Embodiments of the invention are directed to methods of processing a substrate. The substrate, in a processing chamber, is exposed to a reactant gas at a first temperature to form an etch layer on a surface of the substrate. Unreacted reactant gas is removed from the processing chamber. The temperature of the substrate surface is elevated to a second temperature to vaporize the etch layer from the substrate surface. The vaporized etch layer is removed from the processing chamber. The temperature of the substrate surface is decreased to about the first temperature. In detailed embodiments, the first temperature is below an isotropic etch point of the etch layer.

In certain embodiments, the substrate is silicon. In specific embodiments, the reactant gas is fluorine. In detailed embodiments, the first temperature is in the range of about 20° C. to about 50° C. and the second temperature is in the range of about 100° C. to about 200° C.

In some embodiments, exposing the substrate to the reactant gas comprises exposing the substrate to a combination of two or more gases to form the etch layer. In detailed embodiments, the substrate has a silicon dioxide layer on the surface of the substrate and exposing the substrate to the reactant gas comprises exposing the substrate surface to one of water and ammonia followed by exposing the substrate to hydrofluoric acid. In specific embodiments, when water is used, the first temperature is about room temperature and the second temperature is about 50° C. In certain embodiments, when ammonia is used, the first temperature is less than about 35° C. and the second temperature is about 120° C.

Additional embodiments of the invention are directed to methods of processing a substrate. The substrate having a surface is moved laterally beneath a gas distribution plate comprising a plurality of elongate gas ports including a first gas outlet to deliver a first reactive gas. The first gas is delivered to the substrate surface to form an etch layer on the substrate surface. The temperature of the substrate surface is locally changed from a first temperature to a second temperature, the second temperature being sufficient to vaporize the etch layer. The substrate surface is purged of the vaporized etch layer.

In detailed embodiments, the first temperature is below the isotropic etch point of the etch layer and the second temperature is greater than or equal to the isotropic etch point of the etch layer. In specific embodiments, the substrate surface temperature is changed by one or more of radiative heating or resistive heating.

In specific embodiments, the substrate is silicon and the first reactive gas comprises fluorine. In certain embodiments, the second temperature is in the range of about 100° C. to about 200° C.

Further embodiments of the invention are directed to methods of processing a substrate. The substrate having a surface is moved laterally beneath a gas distribution plate comprising a plurality of elongate gas ports including a first gas outlet to deliver a first reactive gas and second gas outlet to deliver a second reactive gas. The first reactive gas is delivered to the substrate surface to form a first reactive layer on the substrate surface. The unreacted first reactive gas is purged. The second reactive gas is delivered to the substrate surface to react with the first reactive layer to form an etch layer on the substrate surface. The unreacted second reactive gas is purged. The temperature of the substrate surface is locally changed from a first temperature to a second temperature, the second temperature being sufficient to vaporize the etch layer. The substrate surface is purged of the vaporized etch layer. In detailed embodiments, the first temperature is below the isotropic etch point of the etch layer and the second temperature is greater than or equal to the isotropic etch point of the etch layer.

In some embodiments, the substrate surface temperature is changed by one or more of radiative heating or resistive heating. In detailed embodiments, the substrate has a silicon oxide layer on the surface and the first reactive gas is one of water and ammonia. In specific embodiments, the second reactive gas is hydrofluoric acid. In certain embodiments, the first temperature is less than about 50° C. and the second temperature is in the range of about 90° C. to about 130° C.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
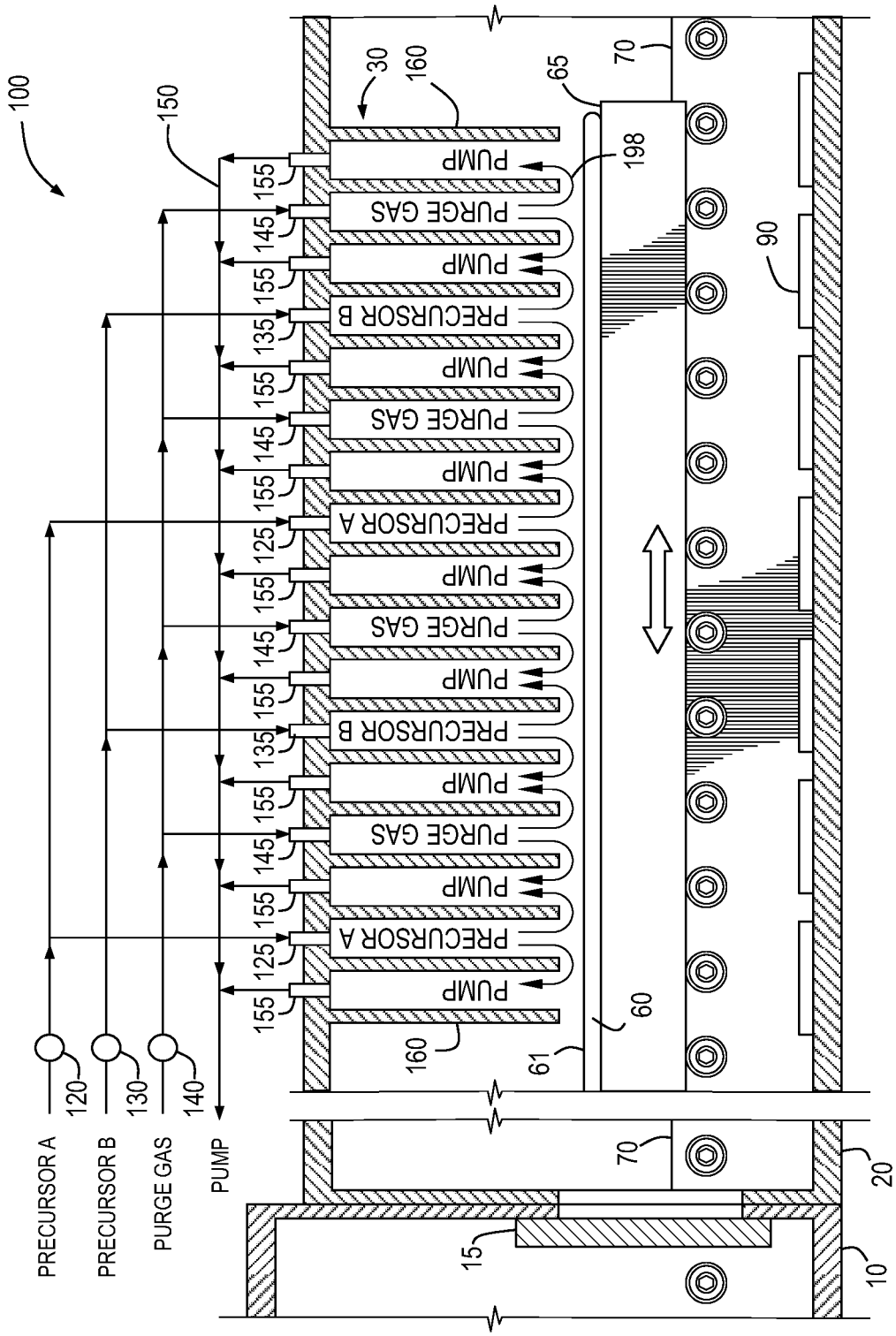
FIG. 1 shows a schematic cross-sectional view of an atomic layer deposition chamber according to one or more embodiments of the invention.

Embodiments of the invention are directed to atomic layer deposition apparatus and methods which provide improved processing of substrates. Specific embodiments of the invention are directed to atomic layer deposition apparatuses (also called cyclical deposition) incorporating at least one thermal element for changing the temperature of a portion of the substrate.

One or more embodiments of the invention are directed to methods of etching a substrate or a material or layer from a substrate surface. The substrate can be processed in any suitable processing chamber including, but not limited to, chemical vapor deposition chambers and atomic layer deposition chambers. In the atomic layer deposition processes, either temporal or spatial separation of the reactant gases, purge gases and temperature changes can be employed. Temporal separation is used to describe a process by which the entire (or nearly entire) processing chamber is exposed to a single gas at a time with purge steps between gases. Spatial separation is described in detail throughout and generally means that a first portion of the substrate is exposed to one reaction condition while a second portion of the substrate can be simultaneously exposed to a different reaction condition. Generally, a substrate processed in a temporal scheme remains stationary, while one processed in a spatial schema moves relative to the gas distribution plate.

In general, atomic layer etching process includes the steps of (1) introducing reactant A at a temperature below the isotropic etch point onto a substrate (or targeted etch material); (2) pump purging the reactant away; (3) heat up the substrate to vaporize the by-product off the substrate; (4) cool down the substrate to the temperature in step 1; and repeating steps 1 to 4 to the desired amount. The hardware may benefit from easy and fast reactant introduction and removal. One example is spatial separation of reactant, pump and purge gas channels. It may also be helpful to have fast and efficient heat and cooling capabilities. Flash lamp, laser or light sources at specific wavelengths ranges or temperature controlled substrate holders can be used to achieve this.

It is known that molecular fluorine will not etch silicon at room temperature (unlike $XeF_2$). Molecular fluorine will start to etch if the silicon temperature was heated up to about 100-200° C. In a spatial process, a substrate portion may be exposed to, for example, purge/pump with laser heating/purge/pump/fluorine/pump/purge/pump with laser heating/purge in a cyclic fashion. The heating can be laser or other sources as described and can be located in various positions.

Another example, generally related to etching silicon dioxide, involves exposing the silicon dioxide surface to an $HF/H_2O$ or $HF/NH_3$ environment. The spatial atomic layer deposition can be arranged so that portions of the substrate or surface are exposed to, sequentially, purge/pump/water or ammonia/pump/purge/pump/HF/pump/purge/pump with heat source/purge. The wafer (substrate) will be exposed in this sequence: $H_2O$/HF/anneal pump and repeat. For the water version, the substrate could be at room temperature and heat up may be as high as 50° C. For the ammonia version, the substrate could be at about 30° C. and heated up to about 120° C.

In some embodiments, a substrate (or substrate surface) is exposed to a reactant gas in a processing chamber. Exposure of the substrate surface to the reactant gas causes the formation of an etch film or etch layer on the surface of the substrate. As used in this specification and the appended claims, the terms "etch film" and "etch layer" are used interchangeably and refer to a film or layer on the surface of a substrate, or a portion of the surface of a substrate, which can be subsequently stripped or removed from the surface. In detailed embodiments, the etch film or etch layer are removed from the surface of the substrate by substantially only increased temperature (or annealing). At this point, excess or unreacted reactant gas is purged or removed from the processing chamber to avoid interference with any additional processes.

After the etch layer is formed on the substrate surface, the temperature of the substrate (or substrate surface) is elevated from a first temperature to a second temperature. At the first temperature, the etch layer is formed on the substrate surface. At the second temperature, however, the etch layer becomes vaporized, thus being removed from the substrate surface, leaving an etched surface. The vaporized etch layer is removed from the processing chamber to avoid deposition upon subsequent lowering of the substrate temperature to the first temperature.

The first temperature is generally lower than the second temperature. In detailed embodiments, the first temperature is below an isotropic etch point of the etch layer and the second temperature is about equal to or greater than the isotropic etch point. As used in this specification and the appended claims, the term "isotropic etch point" is defined as the lowest temperature that can vaporize the reaction by-product (i.e., the etch film).

There are multiple ways to change the temperature of the substrate between the first temperature and the second temperature. In one or more embodiments, the substrate or processing chamber is maintained at the first temperature and elevated to vaporize the etch layer. The temperature can be elevated at any point during or after the formation of the etch layer. In one or more embodiments, the temperature is elevated at substantially the same time as formation of the etch layer. In specific embodiments, the temperature is elevated after formation of the etch layer.

In some embodiments the substrate or processing chamber are maintained at the second temperature and the reactive gas is held at the first temperature so that the gas is cool to temporarily lower the surface temperature of the substrate. After a short time, the temperature of the substrate surface would equilibrate with that of the processing chamber, thereby vaporizing the layer formed on the surface. The temperature of the substrate can be elevated by, for example, radiative, resistive or conductive heating or lowered by, for example, conductive cooling.

In one or more detailed embodiments, the substrate is silicon and the reactant gas is fluorine. The substrate is reacted with the fluorine gas at the first temperature in the range of about 20° C. and about 50° C. to form the etch layer. The substrate temperature is then raised to a second temperature in the range of about 100° C. to about 200° C. to vaporize the etch layer from the surface of the substrate.

In some embodiments, exposing the substrate to the reactant gas comprises more than one step. For example, a combination of two or more gases may be necessary form the etch layer on the substrate surface. While this may require more than one individual gas exposure, it is termed a reactant gas herein because the ultimate conclusion is a etch layer on the substrate. In certain embodiments, the substrate has a silicon dioxide layer on the surface and exposing the substrate to the reactant gas comprises exposing the substrate surface to one of water and ammonia followed by exposing the substrate to hydrofluoric acid. When the substrate is first exposed to water, the first temperature is about room temperature and the second temperature is about 50° C. When the substrate is first exposed to ammonia, the first temperature is less than about 35° C. and the second temperature is about 120° C.

Etching using an atomic layer deposition type process can be useful, allowing for the integration of multiple processes within a single deposition chamber. For example, it is possible to deposit the etch layer at a temperature below the isotropic etch point and subsequently raise the temperature above this point. This is useful where there is an energy barrier that must be overcome to etch a layer from the surface. Additionally, controlling the etching process in this manner may help avoid spontaneous reactions and mitigate the risk of losing control of the etching process.

FIG. 1 is a schematic cross-sectional view of an spatial atomic layer deposition system or system 100 in accordance with one or more embodiments of the invention. The system 100 includes a load lock chamber 10 and a processing chamber 20. The processing chamber 20 is generally a sealable enclosure, which is operated under vacuum, or at least low pressure. The processing chamber 20 is isolated from the load lock chamber 10 by an isolation valve 15. The isolation valve 15 seals the processing chamber 20 from the load lock chamber 10 in a closed position and allows a substrate 60 to be transferred from the load lock chamber 10 through the valve to the processing chamber 20 and vice versa in an open position.

The system 100 includes a gas distribution plate 30 capable of distributing one or more gases across a substrate 60. The gas distribution plate 30 can be any suitable distribution plate known to those skilled in the art, and specific gas distribution plates described should not be taken as limiting the scope of the invention. The output face of the gas distribution plate 30 faces the first surface 61 of the substrate 60.

Substrates for use with the embodiments of the invention can be any suitable substrate. In detailed embodiments, the substrate is a rigid, discrete, generally planar substrate. As used in this specification and the appended claims, the term "discrete" when referring to a substrate means that the substrate has a fixed dimension. The substrate of specific embodiments is a semiconductor substrate, such as a 200 mm or 300 mm diameter silicon substrate.

The gas distribution plate 30 comprises a plurality of gas ports configured to transmit one or more gas streams to the substrate 60 and a plurality of vacuum ports disposed between each gas port and configured to transmit the gas streams out of the processing chamber 20. In the detailed embodiment of FIG. 1, the gas distribution plate 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 is configured to inject a continuous (or pulse) stream of a reactive precursor of compound A into the processing chamber 20 through a plurality of gas ports 125. The precursor injector 130 is configured to inject a continuous (or pulse) stream of a reactive precursor of compound B into the processing chamber 20 through a plurality of gas ports 135. The purge gas injector 140 is configured to inject a continuous (or pulse) stream of a non-reactive or purge gas into the processing chamber 20 through a plurality of gas ports 145. The purge gas is configured to remove reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, thereby avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high intensity light source (e.g., UV energy), or exposure to an x-ray source. Exemplary remote plasma sources are available from vendors such as MKS Instruments, Inc. and Advanced Energy Industries, Inc.

The system 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The system 100 includes a plurality of partitions 160 disposed on the processing chamber 20 between each port. A lower portion of each partition extends close to the first surface 61 of substrate 60, for example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the invention. It will be understood by those skilled in the art that the gas distribution system shown is merely one possible distribution system and the other types of showerheads and gas cushion plates may be employed.

In operation, a substrate 60 is delivered (e.g., by a robot) to the load lock chamber 10 and is placed on a shuttle 65. After the isolation valve 15 is opened, the shuttle 65 is moved along the track 70. Once the shuttle 65 enters in the processing chamber 20, the isolation valve 15 closes, sealing the processing chamber 20. The shuttle 65 is then moved through the processing chamber 20 for processing. In one embodiment, the shuttle 65 is moved in a linear path through the chamber.

As the substrate 60 moves through the processing chamber 20, the first surface 61 of substrate 60 is repeatedly exposed to the precursor of compound A coming from gas ports 125 and the precursor of compound B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the precursors or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discreet steps.

Sufficient space is generally provided at the end of the processing chamber 20 so as to ensure complete exposure by the last gas port in the processing chamber 20. Once the substrate 60 reaches the end of the processing chamber 20 (i.e., the first surface 61 has completely been exposed to every gas port in the processing chamber 20), the substrate 60 returns back in a direction toward the load lock chamber 10. As the substrate 60 moves back toward the load lock chamber 10, the substrate surface may be exposed again to the precursor of compound A, the purge gas, and the precursor of compound B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are configured so as not to remove adsorbed precursors from the substrate surface 110. The width between each partition, the number of gas ports disposed on the processing chamber 20, and the number of times the substrate is passed back and forth may also determine the extent to which the substrate surface 110 is exposed to the various gases. Consequently, the quantity and quality of a deposited film may be optimized by varying the above-referenced factors.

In another embodiment, the system 100 may include a precursor injector 120 and a precursor injector 130, without a purge gas injector 140. Consequently, as the substrate 60 moves through the processing chamber 20, the substrate surface 110 will be alternately exposed to the precursor of compound A and the precursor of compound B, without being exposed to purge gas in between.

The embodiment shown in FIG. 1 has the gas distribution plate 30 above the substrate. While the embodiments have been described and shown with respect to this upright orientation, it will be understood that the inverted orientation is also possible. In that situation, the first surface 61 of the substrate 60 will face downward, while the gas flows toward the substrate will be directed upward.

In yet another embodiment, the system 100 may be configured to process a plurality of substrates. In such an embodiment, the system 100 may include a second load lock chamber (disposed at an opposite end of the load lock chamber 10) and a plurality of substrates 60. The substrates 60 may be delivered to the load lock chamber 10 and retrieved from the second load lock chamber.

In some embodiments, the shuttle 65 is a susceptor 66 for carrying the substrate 60. Generally, the susceptor 66 is a carrier which helps to form a uniform temperature across the substrate. The susceptor 66 is movable in both directions (left-to-right and right-to-left, relative to the arrangement of FIG. 1) between the load lock chamber 10 and the processing chamber 20. The susceptor 66 has a top surface 67 for carrying the substrate 60. The susceptor 66 may be a heated susceptor so that the substrate 60 may be heated for processing. As an example, the susceptor 66 may be heated by radiant heat lamps 90, a heating plate, resistive coils, or other heating devices, disposed underneath the susceptor 66.

Figure 2:
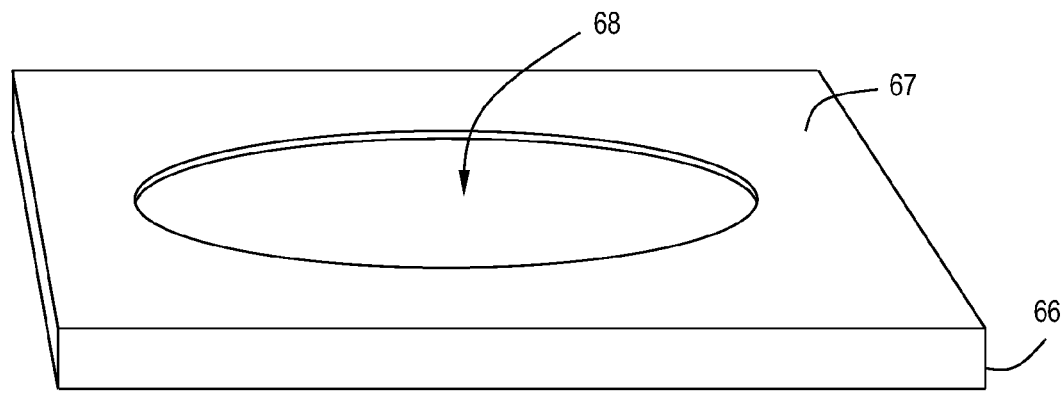
FIG. 2 shows a susceptor in accordance with one or more embodiments of the invention.

In still another embodiment, the top surface 67 of the susceptor 66 includes a recess 68 configured to accept the substrate 60, as shown in FIG. 2. The susceptor 66 is generally thicker than the thickness of the substrate so that there is susceptor material beneath the substrate. In detailed embodiments, the recess 68 is configured such that when the substrate 60 is disposed inside the recess 68, the first surface 61 of substrate 60 is level with the top surface 67 of the susceptor 66. Stated differently, the recess 68 of some embodiments is configured such that when a substrate 60 is disposed therein, the first surface 61 of the substrate 60 does not protrude above the top surface 67 of the susceptor 66.

In some embodiments, the substrate is thermally isolated from the carrier to minimize heat losses. This can be done by any suitable means, including but not limited to, minimizing the surface contact area and using low thermal conductance materials.

Substrates have an inherent thermal budget which is limited based on previous processing done on the substrate. Therefore, it is useful to limit the exposure of the substrate to large temperature variations to avoid exceeding this thermal budget, thereby damaging the previous processing. In some embodiments, the gas distribution plate 30 includes at least one thermal element 80 adapted to cause a local change in temperature at the surface of a portion of the substrate 60. The local change in temperature affects primarily a portion of the surface of the substrate 60 without affecting the bulk temperature of the substrate.

Figure 3:
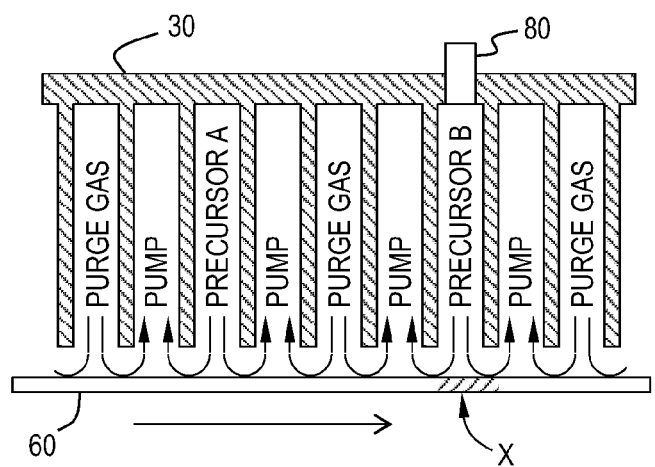
FIG. 3 shows a partial cross-sectional side view of an atomic layer deposition chamber in accordance with one or more embodiments of the invention.

Referring to FIG. 3, in operation, the substrate 60 moves relative to the gas ports of the gas distribution plate 30, as shown by the arrow. The processing chamber 20, in this embodiment, may be held at a first temperature which is suitable for efficient reaction of precursor A with the substrate 60, or layer on the substrate 60, but is too low for efficient reaction of precursor B. In the context of atomic layer etching, the first temperature may be below the isotropic etch point of the reaction product of precursor A (the etchant) and the substrate surface (or layer on the substrate surface). Region X moves past gas ports with purge gases, vacuum ports and a first precursor A port, where the surface of the substrate 60 reacts with the first precursor A. Because the processing chamber 20 is held at a temperature suitable for the precursor A reaction, as the substrate 60 moves to precursor B, the region X is affected by the thermal element 80 and the local temperature of region X is increased. In detailed embodiment, the local temperature of region X is increased to a temperature which reaction of precursor B is favorable. In the context of atomic layer etching, the local temperature of region X can be increased to be about equal to or greater than the isotropic etch point of the etch film. Precursor B can be the etchant gas or can be replaced with an inert gas.

It will be understood by those skilled in the art that, as used and described herein, region X is an artificially fixed point or region of the substrate. In actual use, the region X would be, literally, a moving target, as the substrate is moving adjacent the gas distribution plate 30. For descriptive purposes, the region X shown is at a fixed point during processing of the substrate.

In detailed embodiments, the region X, which is also referred to as a portion of the substrate is limited in size. In some embodiments, the portion of the substrate effected by any individual thermal element is less than about 20% of the area of the substrate. In various embodiments, the portion of the substrate effected by any individual thermal element is less than about 15%, 10%, 5% or 2% of the area of the substrate.

The thermal element 80 can any suitable temperature altering device and can be positioned in many locations. Suitable examples of thermal elements 80 include, but are not limited to, radiative heaters (e.g., lamps and lasers), resistive heaters, liquid controlled heat exchangers and cooling plates.

Figure 4:
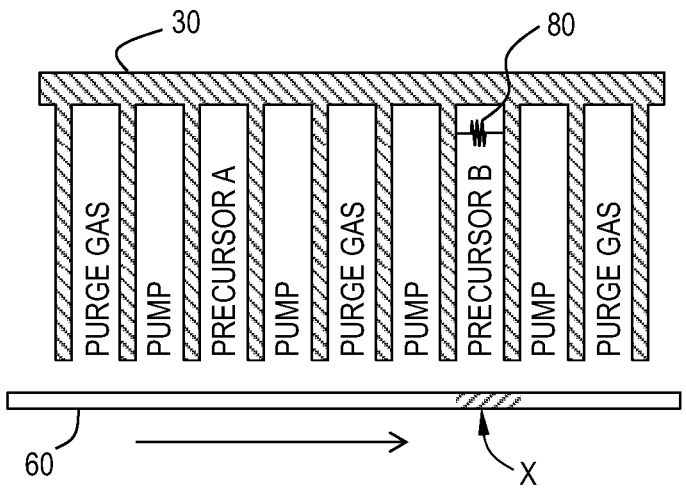
FIG. 4 shows a partial cross-sectional side view of an atomic layer deposition chamber in accordance with one or more embodiments of the invention.
Figure 5:
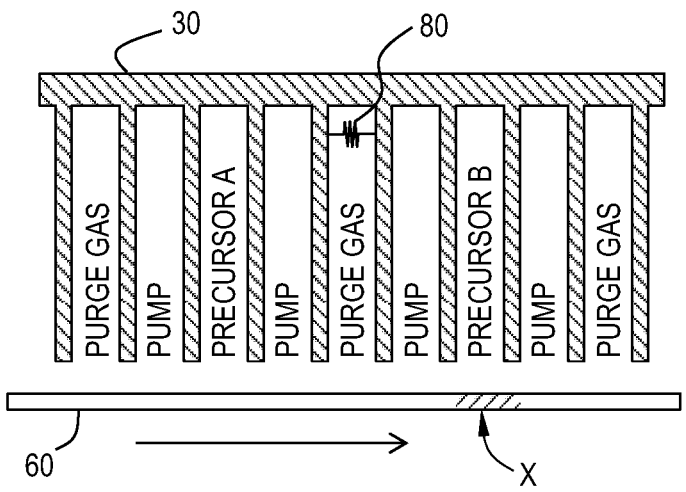
FIG. 5 shows a partial cross-sectional side view of an atomic layer deposition chamber in accordance with one or more embodiments of the invention.

FIGS. 3-6 show various thermal element 80 placements and types. It should be understood that these examples are merely illustrative of some embodiments of the invention are should not be taken as limiting the scope of the invention. In some embodiments, the thermal element 80 is positioned within at least one elongate gas port. Embodiments of this variety are shown in FIGS. 3-5. In FIG. 3, the thermal element 80 is a radiative heater positioned at an entrance to the gas port. The radiative heater can be used to directly heat region X of the substrate 60 as it passes adjacent to the gas port containing the radiative heater. Here, the region X of the substrate is heated and changed when the region X is adjacent about gas port B.

It will be understood by those skilled in the art that there can be more than one thermal element 80 in any given gas distribution plate 30. An example of this would be a gas distribution plate 30 with two repeating units of precursor A and precursor B. If the reaction temperature of precursor B is higher than precursor A, a thermal element may be placed within, or around/near each of the precursor B gas ports.

In specific embodiments, the radiative heater is a laser which is directed along the gas port toward the surface of the substrate 60. It can be seen from FIG. 3 that as region X passes the thermal element, the elevated temperature remains for a period of time. The amount of time that the temperature remains elevated for that region depends on a number of factors. Accordingly, in some embodiments, the radiative heater is positioned at one of the vacuum port or purge gas ports before precursor B gas port. In these embodiments, region X maintains the residual heat long enough to enhance reaction of precursor B. In these embodiments, the region X is heated and the temperature changed in a region extending from about gas port A to about gas port B.

FIGS. 4 and 5 show alternate embodiments of the invention in which the thermal element 80 is a resistive heater. The resistive heater can be any suitable heater known to those skilled in the art including, but not limited to, tubular heaters. In FIG. 4, the resistive heater is positioned within a gas port so that the gas passing the resistive heater is heated. In specific embodiments, the gas passing the resistive heater is heated to a temperature sufficient to provide efficient reaction with the substrate or layer on the substrate. The heated gas passing the resistive heater can then heat the region X of the substrate. In this and similar embodiments, the region X of the substrate 60 surface temperature is changed when the region X at adjacent about gas port B.

FIG. 5 shows an alternate embodiment in which the resistive heater is placed within a purge gas port. The placement of this resistive hater is after the region X encounters precursor A and before it encounters precursor B. Or in the case of atomic layer etching, the resistive heater is placed after the region X is exposed to the etchant gas and precursor B can be omitted or another etchant. The resistive heater of this embodiments heats the purge gas, which upon contact with the substrate, heats the portion, region X, of the substrate. In detailed embodiments, thermal element 80 is positioned such that the purge gas is heated or cooled prior to being flowed through the gas distribution plate.

Some embodiments similar to those of FIGS. 4 and 5 replace the resistive heater with a cooling plate. The cooling plate can be placed within the gas flow in the gas ports to cool the temperature of the gas exiting these ports. In some embodiments, the gas being cooled is one or more of precursor A or precursor B. In detailed embodiments, the thermal element 80 is a cooling plate placed in a purge gas port to cool the purge gas to cool the temperature of the surface of the substrate. The cooling plate can be useful in the atomic layer etching processes as a means of ensuring that the temperature of region X is below the isotropic etch point of an etch layer to be formed by subsequent reaction.

Figure 6:
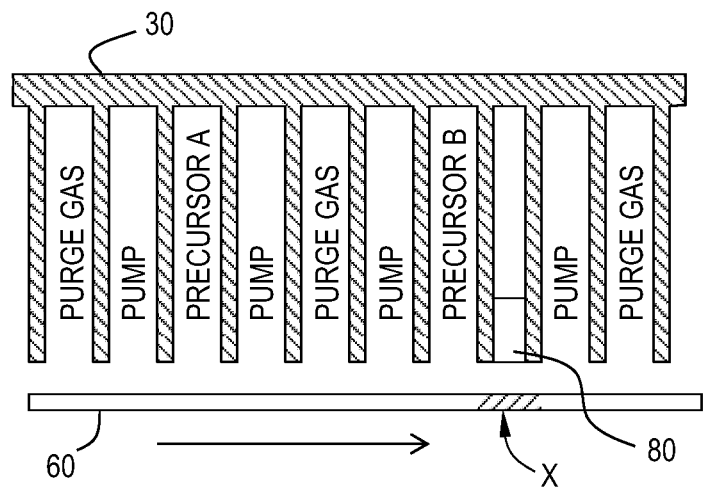
FIG. 6 shows a partial cross-sectional side view of an atomic layer deposition chamber in accordance with one or more embodiments of the invention.

FIG. 6 shows another embodiment of the invention in which the thermal element 80 is positioned at a front face of the gas distribution plate 30. The thermal element 80 is shown in a portion of the gas distribution plate which is between two gas ports. The size of this thermal element can be adjusted as necessary to minimize the gap between the adjacent gas ports. In specific embodiments, the thermal element has a size that is about equal to the width of the partitions 160. The thermal element 80 of these embodiments can be any suitable thermal element including radiative and resistive heaters, or coolers. This particular configuration may be suitable for resistive heaters and cooling plates because of the proximity to the surface of the substrate 60. In detailed embodiments, the thermal element 80 is a resistive heater positioned at a front face of the gas distribution plate to directly heat the portion, region X, of the substrate 60. In specific embodiments, thermal element 80 is a cooling plate positioned at a front face of the gas distribution plate to directly cool the portion, region X, of the substrate 60. In detailed embodiments, the thermal element 80 is positioned on either side of a gas port. These embodiments are particularly suitable for use with reciprocal motion processing where the substrate move back and forth adjacent the gas distribution plate 30.

In a detailed embodiment of FIG. 6, both precursor A and precursor B are the same reactant gas. This reactant gas can be used to create an etch layer on the substrate surface, or region X of the substrate surface. The etch layer can then be vaporized by the elevated temperature resulting from exposure to the thermal element 80. The substrate, or region X, can be exposed to the reactant gas multiple times before being vaporized from the substrate. In various embodiments, the substrate surface is exposed to the etchant gas once, twice, three times, four times or five times before the resultant etch layer is vaporized.

Figure 7:
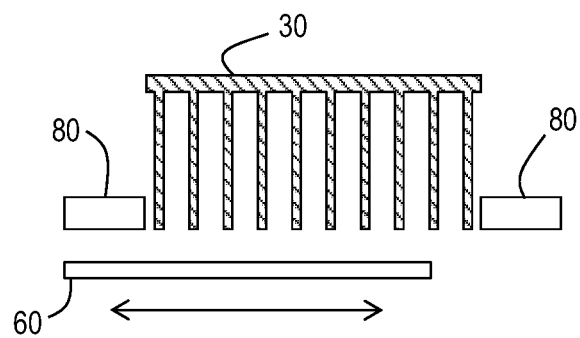
FIG. 7 shows a partial cross-sectional side view of an atomic layer deposition chamber in accordance with one or more embodiments of the invention.

The thermal element 80 may be positioned before and/or after the gas distribution plate 30. This embodiment is suitable for both reciprocal processing chambers in which the substrates moves back and forth adjacent the gas distribution plate, and in continuous (carousel or conveyer) architectures. In detailed embodiments the thermal element 80 is a heat lamp. In the specific embodiment shown in FIG. 7, there are two thermal elements 80, one on either side of the gas distribution plate, so that in reciprocal type processing, the substrate 60 is heated in both processing directions.

Figure 8:
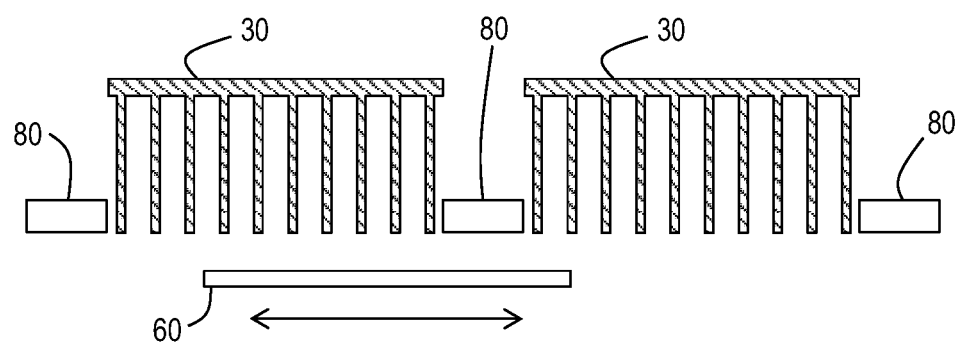
FIG. 8 shows a partial cross-sectional side view of an atomic layer deposition chamber in accordance with one or more embodiments of the invention.

FIG. 8 shows another embodiment of the invention in which there are two gas distribution plates 30 with thermal elements 80 before, after and between each of the gas distribution plates 30. This embodiment is of particular use with reciprocal processing chambers as it allows for more layers to be deposited in a single cycle (one pass back and forth). Because there is a thermal element 80 at the beginning and end of the gas distribution plates 30, the substrate 60 is affected by the thermal element 80 before passing the gas distribution plate 30 in either the forward (e.g., left-to-right) or reverse (e.g., right-to-left) movement. It will be understood by those skilled in the art that the processing chamber 20 can have any number of gas distribution plates 30 with thermal elements 80 before and/or after each of the gas distribution plates 30 and the invention should not be limited to the embodiments shown.

Figure 9:
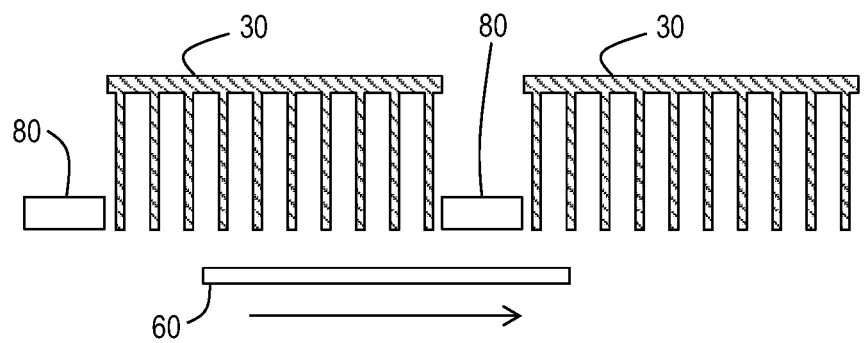
FIG. 9 shows a partial cross-sectional side view of an atomic layer deposition chamber in accordance with one or more embodiments of the invention.

FIG. 9 shows another embodiment similar to that of FIG. 8 without the thermal element 80 after the last gas distribution plate 30. Embodiments of this sort are of particular use with continuous processing, rather than reciprocal processing. For example, the processing chamber 20 may contain any number of gas distribution plates 30 with a thermal element 80 before each plate. Embodiments of this sort may also be particularly useful in atomic layer etching processes. The thermal element 80 before each gas distribution plate can be used to ensure that the substrate temperature is below the isotropic etch point of an etch layer to be formed.

In some embodiments, the thermal element 80 is a gas distribution plate, or portion of a gas distribution plate, which is configured to direct a stream of gas, which has been heated or cooled, toward the surface of the substrate. Additionally, the gas distribution plate can be heated or cooled so that proximity to the substrate can cause a change in the substrate surface temperature. For example, in a continuous processing environment, the processing chamber may have several gas distribution plates, or a single plate with a large number of gas ports. One or more of the gas distribution plates (where there are more than one) or some of the gas ports can be configured to provide heated or cooled gas or radiant energy.

Additional embodiments of the invention are directed to methods of processing a substrate. A substrate 60 is moved laterally adjacent a gas distribution plate 30 comprising a plurality of elongate gas ports. The elongate gas ports include a first gas port A to deliver a first gas and a second gas port B to deliver a second gas. The first gas is delivered to the substrate surface and the second gas is delivered to the substrate surface. The local temperature of the substrate surface is changed during processing. In some embodiments, the temperature is changed locally after delivering the first gas to the substrate surface and before delivering the second gas to the substrate surface. In detailed embodiments, the temperature is changed locally about the same time as delivering the first gas or about the same time as delivering the second gas.

In detailed embodiments, the substrate surface temperature is directly changed by one or more of radiative heating, resistive heating and cooling the substrate surface. In specific embodiments, the substrate surface temperature is indirectly changed by one or more of resistively heating and cooling one or more of the first gas and the second gas.

Figure 10:
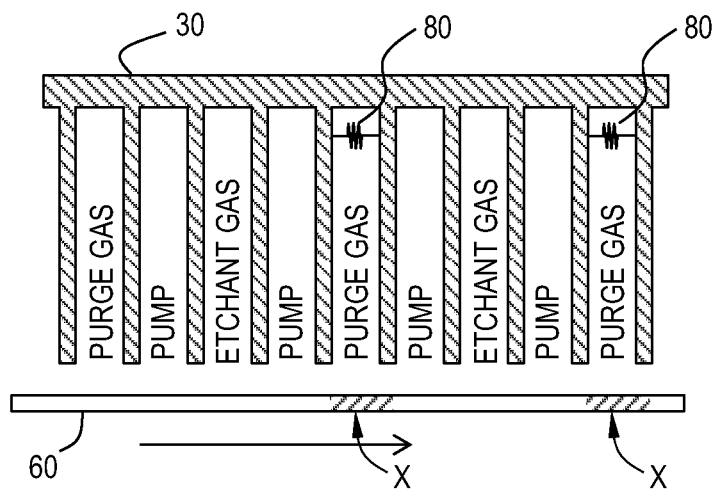
FIG. 10 shows a partial cross-sectional side view of an atomic layer deposition chamber in accordance with one or more embodiments of the invention.

FIG. 10 shows an embodiment which may be of particular use in atomic layer etching. A substrate 60 is laterally moved beneath the gas distribution plate 30. A first gas (also referred to as an etchant gas, an etch gas, a precursor, etc.) is delivered to the surface of the substrate, or region X of the substrate, to form an etch layer. The local temperature of the substrate, or region X, is changed from a first temperature to a second temperature using the thermal element 80. Elevating the temperature of the substrate surface (or a portion of the substrate surface, in the case of spatial processing) causes the etch film to be vaporized from the surface of the substrate. After the film has been etched, the vaporized etch film is removed from the processing chamber.

The embodiment shown in FIG. 10 includes two separate etchant gas ports followed by a thermal element 80. It will be understood by those skilled in the art that an additional pump port will be located downstream of the second thermal element 80 in order to ensure that the vaporized etch layer is removed from the processing chamber. While two distinct etchant gas port/thermal element combinations are shown, any number can be used. In various embodiments, a single pass of the substrate beneath the gas distribution plate results in at least one, two, three, four, five, six, seven, eight, nine or ten etch layer formation/vaporization processes.

Figure 11:
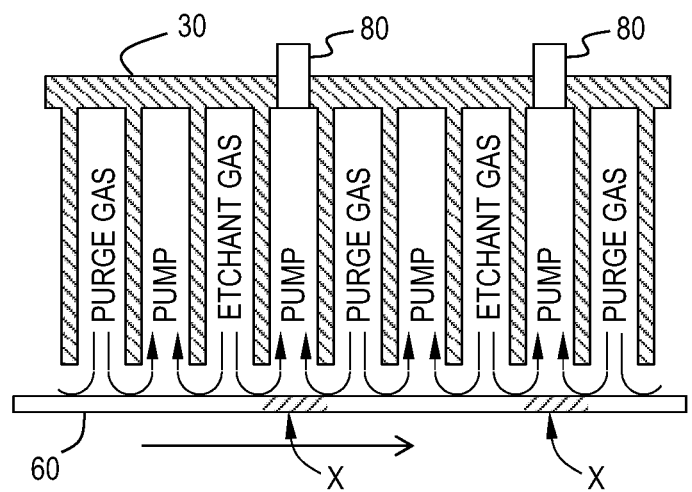
FIG. 11 shows a partial cross-sectional side view of an atomic layer deposition chamber in accordance with one or more embodiments of the invention.

In the embodiment shown, the thermal element 80 provides heat to the substrate surface by heating the purge gas. It will be understood that the thermal element 80 can be, for example, a radiant heat source located in any or all of the pump or purge channels following the etchant gas. FIG. 11 shows an embodiment of the invention in which a radiant heat source (e.g., a laser) is positioned in the pump channel adjacent to and downstream of the etchant gas port. Again, there are two distinct etch gas/thermal element 80 units shown, but it will be understood that this is merely one possible configuration and that other configurations are within the scope of the invention. Positioning the thermal elements 80 in the pump (or vacuum) channels may be desirable as the by-product created by vaporizing the film can be immediately removed from the chamber. This minimizes the potential for condensation of the by-product onto the substrate surface or a surface of the processing chamber.

Figure 12:
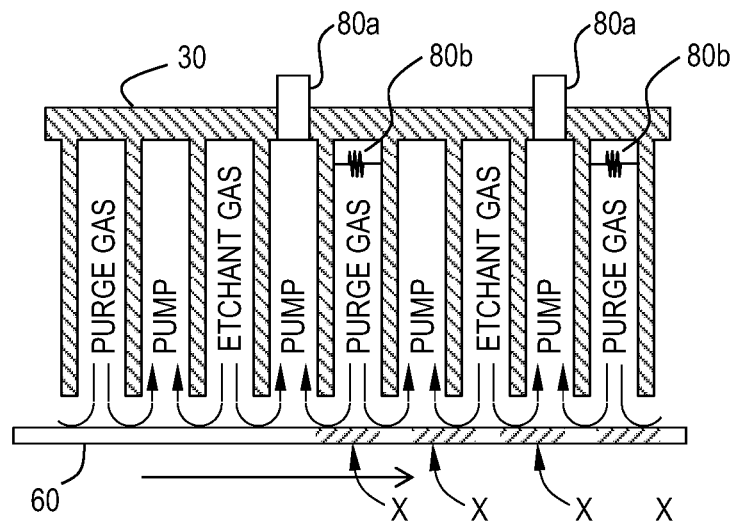
FIG. 12 shows a partial cross-sectional side view of an atomic layer deposition chamber in accordance with one or more embodiments of the invention.

FIG. 12 shows another detailed embodiment in which there are two different thermal elements 80a, 80b used to elevate the temperature and cool the temperature of the substrate, respectively. In this embodiment, the region X, having a first temperature below the isotropic etch point of a layer to be formed, is first exposed to an etchant gas to form an etch layer on the substrate. The region X is then exposed to a pump channel with a radiant thermal element 80a which elevates the temperature of region X to equal to or greater than the isotropic etch point to vaporize the etch film from the substrate surface. Although the region X is said to be "exposed to" the reactant gas, it will be understood that the reactant gas can be said to "contact" the region X. These phrases can be used interchangeably. The region X then is exposed to a purge gas which has been passed across a cooling thermal element 80b. The cooling thermal element 80b can be any suitable cooler, for example, a cold wire in the gas path. Between the purge gas and the cooling thermal element 80b, the temperature of the substrate surface at region X is lowered below the isotropic etch point of the etch film so that subsequent processing can occur.

Figure 13:
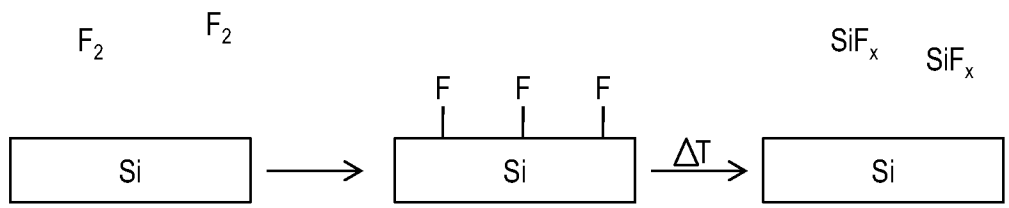
FIG. 13 shows a reaction scheme in accordance with one or more embodiments of the invention.

FIG. 13 shows a detailed embodiment of the invention in which the substrate is silicon and the first reactive gas comprises fluorine. The fluorine reacts with and deposits onto the silicon surface forming a silicon fluoride film. This reaction can take place at any suitable first temperature below the isotropic etch point. In various embodiments, the first temperature is in the range of about 0° C. to about 75° C., or in the range of about 10° C. to about 65° C., or in the range of about 20° C. to about 50° C., or in the range of about room temperature to about 45° C., or less than about 50° C., or less than about 40° C., or less than about 30° C. As used in this specification and the appended claims, the term "room temperature" means a temperature of about 25±2° C. Excess (i.e., unreacted) gases are pumped away from the surface of the substrate to avoid losing control of the etch process.

The temperature of the substrate (or a portion of the substrate) is elevated by any suitable means to a second temperature greater than the isotropic etch point of the silicon fluoride film. At this second temperature the silicon fluoride film is vaporized from the surface of the substrate resulting in a clean silicon surface and silicon fluoride species in the gas phase. In various embodiments, the second temperature is in the range of about 80° C. to about 220° C., or in the range of about 100° C. to about 200° C., or greater than about 80° C., or greater than about 90° C., or greater than about 100° C., or greater than about 120° C., or greater than about 140° C. The silicon fluoride species in the gas phase are then removed from the processing chamber to avoid further reactions with the surface of the substrate upon cooling the substrate to the first temperature. In the spatial atomic layer deposition schema, the gas phase etched layer can be pumped from the surface of the substrate immediately after the thermal element heats the portion of the substrate.

Referring again to FIG. 6, another embodiment of the invention incorporates at least two reactive gases to form the etch layer. The precursor A port can provide the first reactive gas to the substrate surface and the precursor B port can provide the second reactive gas to the substrate surface. The first reactive gas and second reactive gas are used together to create the etch layer on the surface of the substrate. Elevating the temperature of the substrate then vaporizes this etch layer.

Figure 14:
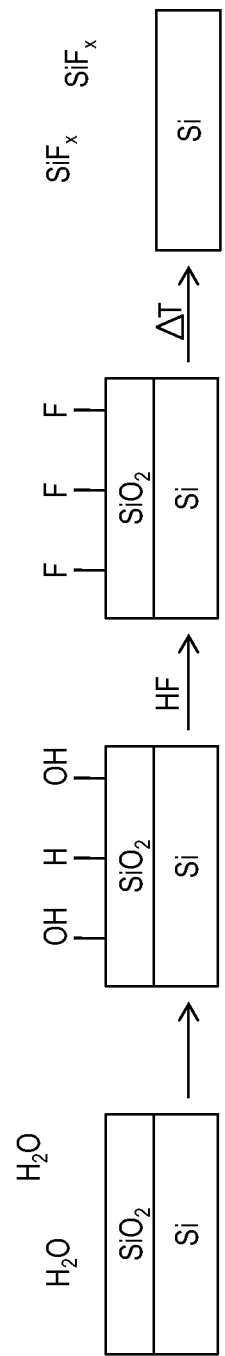
FIG. 14 shows a reaction scheme in accordance with one or more embodiments of the invention.

FIG. 14 shows an example of this reaction schema in which the substrate is silicon and there is a silicon oxide layer on the surface of the substrate. The first reactive gas is delivered to the substrate surface to form a first reactive layer on the substrate surface. The first reactive gas is shown as water, but can also be ammonia, as will be understood by those skilled in the art. The first reactive gas forms a first reactive layer on the surface of the silicon oxide. Excess first reactive gas is removed from the area of the surface of the substrate to avoid gas phase reactions in subsequent steps. The second reactive gas, shown as hydrofluoric acid, is flowed toward the substrate surface to react with the first reactive layer on the substrate to form an etch layer. The excess hydrofluoric acid is then pumped away from the surface of the substrate to avoid further reactions in subsequent steps. The local temperature of the substrate surface is changed from a first temperature to a second temperature to vaporize the etch layer. The vaporized etch layer is then pumped from the processing chamber.

In various embodiments, the first temperature is less than about 50° C., or less than about 40° C., or less than about 30° C. In certain embodiments, the second temperature is in the range of about 90° C. to about 130° C., or in the range of about 100° C. to about 125° C., or in the range of about 100° C. to about 120° C.

Other etch reactions are contemplated and are within the scope of the invention. For example germanium substrates can be etched with, for example, hydrofluoric acid. This particular reaction is similar to the silicon etching described but generally with higher temperatures. Carbon containing materials can be etched with, for example, oxygen or ozone at different temperatures. Additionally, carbon films and organic films can be created and etched according to the described processes. Carbon and hydrocarbon or organic films can use $O_2$ or $O_3$ to etch at different temperatures. The optimal temperature will depend on the specific compounds being used.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
laterally moving a surface beneath a gas distribution plate comprising a plurality of elongate gas ports including a first gas outlet to deliver a first reactive gas, the first reactive gas comprising a fluorine-containing compound;
delivering the first reactive gas to the surface to form an etch layer on the surface;
locally changing the temperature of the surface from a first temperature to a second temperature, the second temperature being sufficient to vaporize the etch layer; and
locally removing the vaporized etch layer from the surface, wherein the at least one portion of the surface is being exposed to the first reactive gas while the local temperature of a different portion of the surface is being changed.

2. The method of claim 1, wherein first temperature is below the isotropic etch point of the etch layer and the second temperature is greater than or equal to the isotropic etch point of the etch layer.

3. The method of claim 1, wherein the surface temperature is changed by one or more of radiative heating or resistive heating.

4. The method of claim 1, wherein the surface comprises silicon and the first reactive gas comprises fluorine.

5. The method of claim 4, wherein the second temperature is in the range of about 100° C. to about 200° C.

6. A method of processing a substrate comprising:
laterally moving a surface comprising an oxide beneath a gas distribution plate comprising a plurality of elongate gas ports including a first gas outlet to deliver a first reactive gas and a second gas outlet to deliver a second reactive gas;
delivering the first reactive gas to the surface to form a first reactive layer on the surface, the first reactive gas comprising one or more of ammonia and water;
purging unreacted first reactive gas;
delivering the second reactive gas to the surface to react with the first reactive layer to form an etch layer on the surface, the second reactive gas comprising hydrofluoric acid;

purging unreacted second reactive gas;

locally changing temperature of the surface from a first temperature to a second temperature, the second temperature being sufficient to vaporize the etch layer; and purging the surface of the vaporized etch layer, wherein at least one portion of the surface is being exposed to the first reactive gas while at least one different portion of the surface is being exposed to the second reactive gas and the local temperature of a different portion of the surface is being changed.

7. The method of claim 6, wherein first temperature is below the isotropic etch point of the etch layer and the second temperature is greater than or equal to the isotropic etch point of the etch layer.

8. The method of claim 6, wherein the surface temperature is changed by one or more of radiative heating or resistive heating.

9. The method of claim 6, wherein the first reactive gas comprises water and the first temperature is about room temperature and the second temperature is about 50° C.

10. The method of claim 6, wherein the first reactive gas comprises ammonia and the first temperature is less than about 35° C. and the second temperature is about 120° C.

11. The method of claim 6, wherein the first temperature is less than about 50° C. and the second temperature is in the range of about 90° C. to about 130° C.

* * * * *